(12) United States Patent
Hristov

(10) Patent No.: US 9,229,039 B2
(45) Date of Patent: Jan. 5, 2016

(54) MEASURING VOLTAGE

(71) Applicant: Luben Hristov Hristov, Sofia (BG)

(72) Inventor: Luben Hristov Hristov, Sofia (BG)

(73) Assignee: Atmel Corporation, San Jose, CA (US)

( * ) Notice: Subject to any disclaimer, the term of this patent is extended or adjusted under 35 U.S.C. 154(b) by 185 days.

(21) Appl. No.: 14/145,604

(22) Filed: Dec. 31, 2013

(65) Prior Publication Data

US 2014/0111225 A1 Apr. 24, 2014

Related U.S. Application Data

(63) Continuation of application No. 13/194,282, filed on Jul. 29, 2011, now Pat. No. 8,624,607.

(51) Int. Cl.
| | |
|---|---|
| G01R 27/26 | (2006.01) |
| G06F 3/041 | (2006.01) |
| G06F 3/044 | (2006.01) |
| H03K 17/96 | (2006.01) |

(52) U.S. Cl.
CPC ............ *G01R 27/2605* (2013.01); *G06F 3/044* (2013.01); *G06F 3/0416* (2013.01); *H03K 17/9622* (2013.01); *H03K 2217/96073* (2013.01)

(58) Field of Classification Search
CPC ................. G01D 5/24; H03K 17/955; H03K 2217/960725
USPC ......................................... 324/667, 672, 674
See application file for complete search history.

(56) References Cited

U.S. PATENT DOCUMENTS

| | | | |
|---|---|---|---|
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |
| 2008/0309635 A1 | 12/2008 | Matsuo | |
| 2009/0315854 A1 | 12/2009 | Matsuo | |
| 2010/0102832 A1 | 4/2010 | Bartling et al. | |
| 2010/0181180 A1* | 7/2010 | Peter .................... | H03K 17/955 200/5 R |

(Continued)

FOREIGN PATENT DOCUMENTS

WO   WO 2012/129247 A2   9/2012

OTHER PUBLICATIONS

U.S. Appl. No. 61/454,936, filed Mar. 21, 2011, Myers.

(Continued)

*Primary Examiner* — Vincent Q Nguyen
(74) *Attorney, Agent, or Firm* — Baker Botts L.L.P.

(57) ABSTRACT

In one embodiment, a method includes receiving one of a number of first voltages. Each of the first voltages results at least in part from a signal applied to an electrode of each of one or more nodes of a capacitive touch sensor. The method also includes receiving a second voltage across a measurement capacitor. The second voltage results at least in part on charging the measurement capacitor through application of a pre-determined voltage. The method also includes monitoring an output voltage during the charging of the measurement capacitor. The output voltage changes state based at least in part on a comparison of the second voltage relative to the one of the first voltages.

20 Claims, 9 Drawing Sheets

(56) References Cited

U.S. PATENT DOCUMENTS

| | | |
|---|---|---|
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |

OTHER PUBLICATIONS

U.S. Appl. No. 61/454,950, filed Mar. 21, 2011, Lynch.
U.S. Appl. No. 61/454,894, filed Mar. 21, 2011, Rothkopf.

* cited by examiner

MEASURING VOLTAGE

RELATED APPLICATION

This application is a continuation, under 35 U.S.C. §120, of U.S. patent application Ser. No. 13/194,282, filed Jul. 29, 2011, entitled Measuring Voltage.

TECHNICAL FIELD

This disclosure generally relates to measuring voltage.

BACKGROUND

An array of conductive drive and sense electrodes may form a mutual-capacitance touch sensor having one or more capacitive nodes. The mutual-capacitance touch sensor may have either a two-layer configuration or single-layer configuration. In the two-layer configuration, drive electrodes may be disposed in a pattern on one side of a dielectric substrate and sense electrodes disposed in a pattern on another side of the substrate. An intersection of a drive electrode and a sense electrodes in the array may form a capacitive node. At the intersection, the drive and sense electrodes may come near each other, but they do not make electrical contact with each other. Instead, the sense electrode is capacitively coupled to the drive electrode. In the single-layer configuration, drive and sense electrodes may be disposed in a pattern on one side of a substrate. In such a configuration, a pair of drive and sense electrodes capacitively coupled to each other across a space or dielectric between electrodes may form a capacitive node.

A pulsed or, in some cases, alternating voltage applied to the drive electrode may induce a charge on the sense electrode, and the amount of charge induced may be susceptible to external influence (such as a touch by or the proximity of an object). When an object, separated from drive and sense electrodes by a dielectric layer, comes within proximity of the drive and sense electrodes, a change in capacitance may occur at that capacitive node and a controller may measure the change in capacitance as a change in voltage. By measuring voltages throughout the array and applying an algorithm to the measured signal, the controller may determine the position of the touch or proximity on the touch sensor.

In a single-layer configuration for a self-capacitance implementation, an array of vertical and horizontal conductive electrodes of only a single type (e.g. drive) may be disposed in a pattern on one side of the substrate. Each of the conductive electrodes in the array may form a capacitive node, and, when an object touches or comes within proximity of the electrode, a change in self-capacitance may occur at that capacitive node and a controller may measure the change in capacitance as a change in voltage or a change in the amount of charge needed to raise the voltage to some predetermined amount. As with a mutual-capacitance touch screen, by measuring voltages throughout the array, the controller may determine the position of the touch or proximity on the touch sensor.

In a touch-sensitive display application, a touch screen may enable a user to interact directly with what is displayed on a display underneath the touch screen, rather than indirectly with a mouse or touchpad. A touch screen may be attached to or provided as part of, for example, a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch screen.

DESCRIPTION OF EXAMPLE EMBODIMENTS

Figure 1:
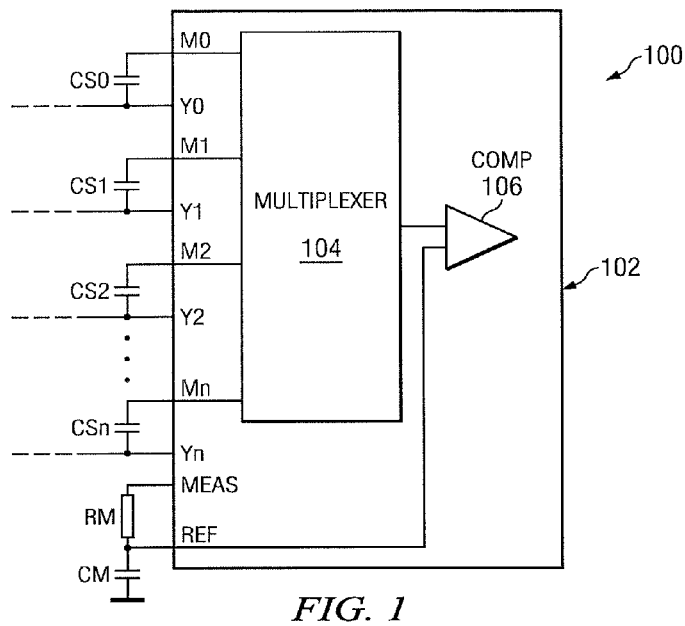
FIG. 1 illustrates an example system for measuring voltage.

FIG. 1 illustrates an example system 100 for measuring voltage. In the example of FIG. 1, system 100 includes a controller 102 with an analog multiplexer 104 and a comparator 106. Controller 102 is coupled to one or more sense lines Y0-Yn, one or more sampling capacitors CS0-CSn, a measurement resistor RM, and a measurement capacitor CM. Each of sampling capacitors CS0-CSn has a terminal coupled to a corresponding one of sense lines Y0-Yn and another terminal coupled to a corresponding one of inputs M0-Mn to analog multiplexer 104. The output of analog multiplexer 104 is coupled to one of the inputs of comparator 102, and a terminal of measurement capacitor CM is coupled through terminal REF to another one of the inputs to comparator 106. That same terminal of measurement capacitor CM is also coupled through measurement resistor RM to terminal MEAS of controller 102. The other terminal of measurement capacitor CM is coupled to ground. Although this disclosure describes and illustrates a particular arrangement of particular components for system 100, this disclosure contemplates any suitable arrangement of any suitable components for system 100.

Controller 102 may be coupled to a touch sensor through one or more sense lines Y0-Yn. In particular embodiments, the touch sensor may be a mutual-capacitance touch sensor that includes an array of drive electrodes and sense electrodes coupled to one of corresponding drive lines and sense lines Y0-Yn, respectively. Each intersection of a drive electrode and sense electrode forms a capacitive node. In other particular embodiments, the touch sensor may be a self-capacitance touch sensor. The self-capacitance touch sensor includes one or more electrodes in horizontal and vertical directions, where each electrode may be coupled to one of corresponding sense line Y0-Yn (otherwise referred to as SNS or SNSK in self-capacitance touch sensor applications). Self-capacitance touch sensor detects a presence of an object as an interaction between an object (not shown) and an electric field generated by one or more electrodes of self-capacitance touch sensor. Although this disclosure describes a particular controller having particular functionality with respect to particular touch sensors, this disclosure contemplates any suitable controller having any suitable functionality with respect to any suitable application without use of touch sensors.

Controller 102 may detect and process a change in capacitance to determine the presence and location of a touch or proximity input. Controller 102 may then communicate information about the touch, detecting a touch position without surface contact ("hovering"), or proximity input to one or more other components (such one or more central processing units (CPUs) or digital signal processors (DSPs)) of a device, which may respond to the touch or proximity input by initiating a function of the device (or an application running on the device) associated with it. Controller 102 may be one or more integrated circuits (ICs), such as for example general-purpose microprocessors, microcontrollers, programmable logic devices or arrays, application-specific ICs (ASICs). Although this disclosure describes and illustrates a particular controller in the device, this disclosure contemplates any suitable controller in the device.

Sense lines Y0-Yn are configured to communicate one or more voltages to inputs M0-Mn of analog multiplexer 104. The analog multiplexer 104 selects one of the voltages from sense lines Y0-Yn stored across sampling capacitors CS0-CSn and transmits the selected voltage to one of the inputs of comparator 106 for comparison with the voltage across measurement capacitor CM, as discussed below. In particular embodiments, analog multiplexer 104 selects the voltage across each sampling capacitor CS0-CSn in accordance with a predetermined sequence.

As discussed above, comparator 106 compares the voltage across measurement capacitor CM to the voltage across selected one of sampling capacitors CS0-CSn. The voltage across the measurement capacitor CM is increased by providing charge through measurement resistor RM. Charging of measurement capacitor CM may be initiated by coupling measurement resistor RM to terminal MEAS of controller 102. In particular embodiments, terminal MEAS is configured to alternatively provide ground or a supply voltage. Since the supply voltage, resistance of measurement resistor RM, and capacitance of measurement capacitor CM are constant, the voltage across measurement capacitor CM is a function of time.

The output of comparator 106 is monitored during charging of measurement capacitor CM. When the voltage across measurement capacitor CM is substantially equal or greater than the voltage across the selected one of sampling capacitors CS0-CSn, the output of the comparator 106 changes state. The voltage across selected one of sampling capacitors CS0-CSn, or a value proportional to the voltage, may be determined from an amount of time elapsed from a start of charging measurement capacitor CM until the change in state of the output of comparator 106. After determining the amount of time from the start of the charging of the measurement capacitor CM until a change in state of the output of the comparator 106, measurement capacitor CM may be discharged in preparation for subsequent voltage measurement. The amount of time may be then determined for the voltage across another one of sampling capacitors CS0-CSn.

Figure 2:
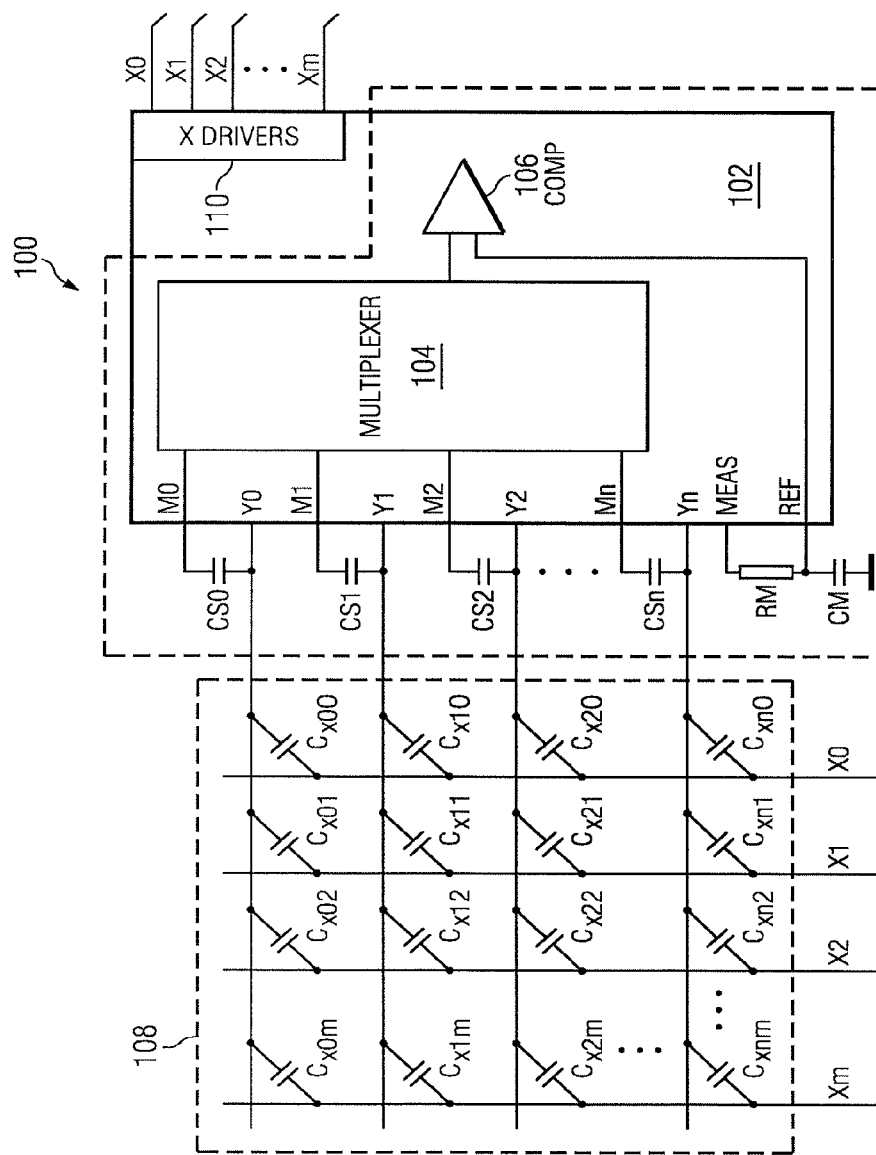
FIG. 2 illustrates an example use of the example system of FIG. 1 with a mutual-capacitance touch sensor.

FIG. 2 illustrates an example use of the example system 100 of FIG. 1 with a mutual-capacitance touch screen 108. As illustrated in the example of FIG. 2, example system 100 of FIG. 1 may be further configured to measure voltages from mutual-capacitance touch screen 108. In particular embodiments, controller 102 includes a driver 110 coupled to one or more drive lines X0-Xm. Mutual-capacitance touch screen 108 includes an array of drive electrodes and sense electrodes coupled to one of corresponding drive lines X0-Xm and sense lines Y0-Yn, respectively. Each intersection of a drive electrode (electrode$_i$) and sense electrode (electrode$_j$) forms a capacitive node $C_{x00}$-$C_{xnm}$($C_{ji}$ (i=0 ... n, j=0 ... m)).

Driver 110 transmits a drive signal to one or more columns of drive electrodes through drive lines X0-Xm. The drive signal induces charge on the associated sense electrode through capacitive nodes $C_{x00}$-$C_{xnm}$. Interaction between an object (not shown) and mutual-capacitance touch screen 108 may affect the amount of charge induced on one or more sense electrodes. The induced charge may be transferred from the sense electrodes to sampling capacitors CS0-CSn through sense lines Y0-Yn and stored as a voltage across sampling capacitors CS0-CSn, as discussed above. In particular embodiments, charge may be accumulated on sense electrodes through bursts of two or more charge transfers.

TABLE 1 illustrates an example sequence of operations for measuring voltage from mutual-capacitance touch sensor 108. Steps 1-10 transfer charge induced on the sense electrode to corresponding sampling capacitor CS0-CSn. In particular embodiments, steps 1-9 are performed a number of times corresponding to a burst length associated with the mutual-capacitance touch sensor 108. Steps 11-15 measures voltage across each sampling capacitors CS0-CSn by measuring the amount of time elapsed from the start of charging measurement capacitor CM until the voltage across measurement capacitor CM through terminal REF is substantially equal or higher than the voltage across the selected one of sampling capacitors CS0-CSn, as discussed above. In particular embodiments, step 14 performs steps 11-13 for each column of drive electrodes. Although this disclosure describes and illustrates a particular sequence of steps in TABLE 1, this disclosure contemplates any suitable sequence of steps in system 100 for measuring voltages.

TABLE 1

| Step | X | Y | M | REF | MEAS | Description |
|---|---|---|---|---|---|---|
| 1 | 0 | 0 | 0 | 0 | 0 | Initial discharge state - all capacitors will be fully discharged |

TABLE 1-continued

| Step | X | Y | M | REF | MEAS | Description |
|---|---|---|---|---|---|---|
| 2 | 1 | 0 | 0 | 0 | 0 | Prepare the drive lines X0-Xm for charge transfer |
| 3 | 1 | 0 | F | 0 | 0 | Float multiplexer inputs M0-Mn |
| 4 | 1 | F | F | 0 | 0 | Float sense lines Y0-Yn |
| 5 | 1 | F | 0 | 0 | 0 | Couple multiplexer inputs M0-Mn to ground |
| 6 | 0 | F | 0 | 0 | 0 | Charge transfer to sampling capacitors CS0-CSn |
| 7 | 0 | F | F | 0 | 0 | End of charge transfer |
| 8 | 0 | 0 | F | 0 | 0 | Provide ground to sense lines Y0-Yn |
| 9 | 1 | F | F | 0 | 0 | Return selected drive line X0-Xm to the high state and prepare for new transfer |
| 10 | | | | | | Repeat operations 4-9 N times |
| 11 | 0 | 0 | F | 0 | 0 | Couple comparator 106 to multiplexer 104 and terminal REF. Select multiplexer input M0-Mn. Connect sense lines Y0-Yn to ground and set drive lines X0-Xm to ground |
| 12 | 0 | 0 | F | F | 1 | Start charging CM by coupling RM to power supply. Start measuring the time until the state of the output of comparator 102 changes |
| 13 | 0 | 0 | F | 0 | 0 | Discharge measurement capacitor CM through the comparator 102 input and terminals REF and MEAS |
| 14 | | | | | | Repeat operations 11-13 for each line Y0-Yn |
| 15 | 0 | 0 | 0 | 0 | 0 | Discharge sampling capacitors CS0-CSn, repeat for active drive lines X0-Xm |
| 16 | 0 | 0 | 0 | 0 | 0 | Discharge all capacitors |

F = floating, i.e., high-impedance state
0 = logic low
1 = logic high

Figure 3:
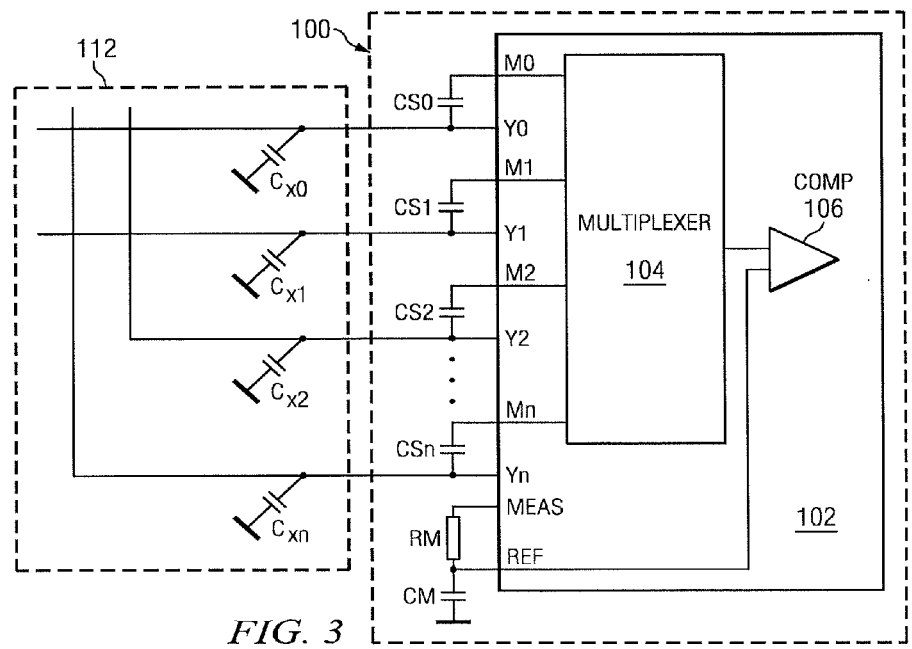
FIG. 3 illustrates an example use of the example system of FIG. 1 with a self-capacitance touch sensor.

FIG. 3 illustrates an example use of the example system of FIG. 1 with a self-capacitance touch sensor 112. As discussed above, self-capacitance touch sensor 112 includes one or more electrodes coupled to corresponding one of sense lines Y0-Yn. An interaction between an object and an electric field generated by one or more horizontal and vertical electrodes of self-capacitance touch sensor 112 is measured as a voltage stored on sampling capacitors CS0-CSn. The voltage results from a difference in capacitance formed between the object and the electrode compared to a free space capacitance of the electrode. As discussed above, voltages across sampling capacitors CS0-CSn are measured from the amount of time from the start of charging measurement capacitor CM until the voltage across measurement capacitor CM through terminal REF is substantially equal or higher than the voltage across the selected one of sampling capacitors CS0-CSn. In particular embodiments, measuring voltages from self-capacitance touch sensor 112 may be performed using operations 11-13 of TABLE 1 discussed above.

Figure 4A:
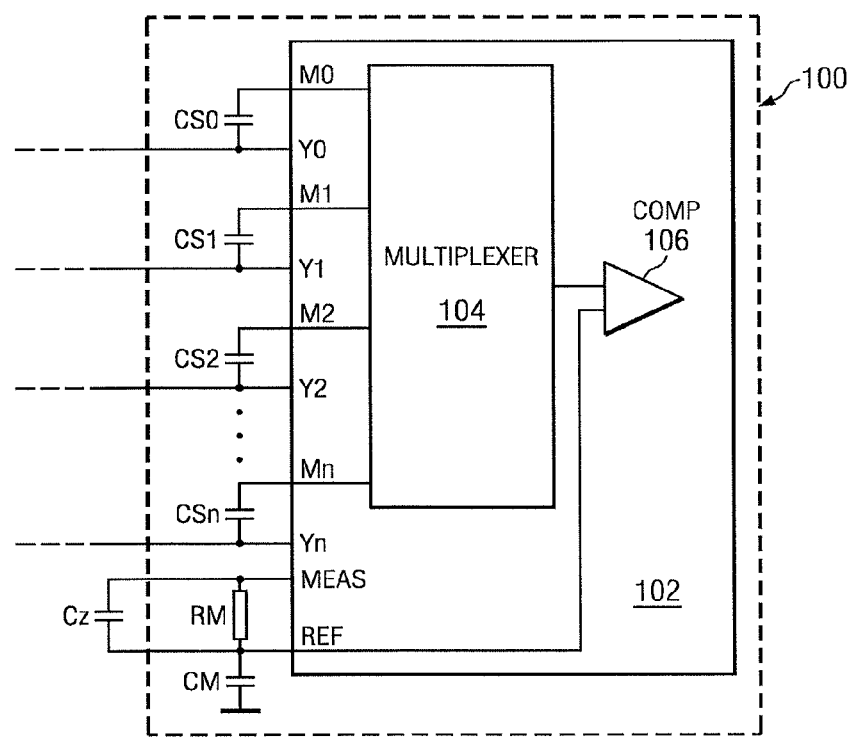
FIG. 4A illustrates an example system for measuring voltage using capacitive charging through a single capacitor.

FIG. 4A illustrates an example system for measuring voltage using capacitive charging through a single capacitor. In practical terms, the rate in which the operations of TABLE 1 may be performed may be limited by the amount of time elapsed between the start of charging measurement capacitor CM until the voltage across measurement capacitor CM is substantially equal or higher than the voltage across the selected one of sampling capacitors CS0-CSn. Reducing the amount of time required to change the state of the comparator 106 increases the rate in which measuring voltages across sampling capacitors CS0-CSn may be performed.

As illustrated in the example of FIG. 4A, a predetermined amount of charge may be transferred from an additional capacitor CZ coupled in series with the measurement capacitor CM prior to resistive charging through measurement resistor RM. As discussed above, the voltage across selected one of sampling capacitors CS0-CSn may be transmitted to comparator 106 through corresponding input M0-Mn of multiplexer 104. Providing the supply voltage to terminal MEAS initiates charging of the measurement capacitor CM and forms a capacitive voltage divider with capacitor CZ and measurement capacitor CM. Resistive charging of measurement capacitor CM through measurement resistor RM predominates the charging process after capacitive charging from capacitor CZ. In other particular embodiments, the capacitance of capacitor CZ is smaller than the capacitance of measurement capacitor CM.

Figure 4B:
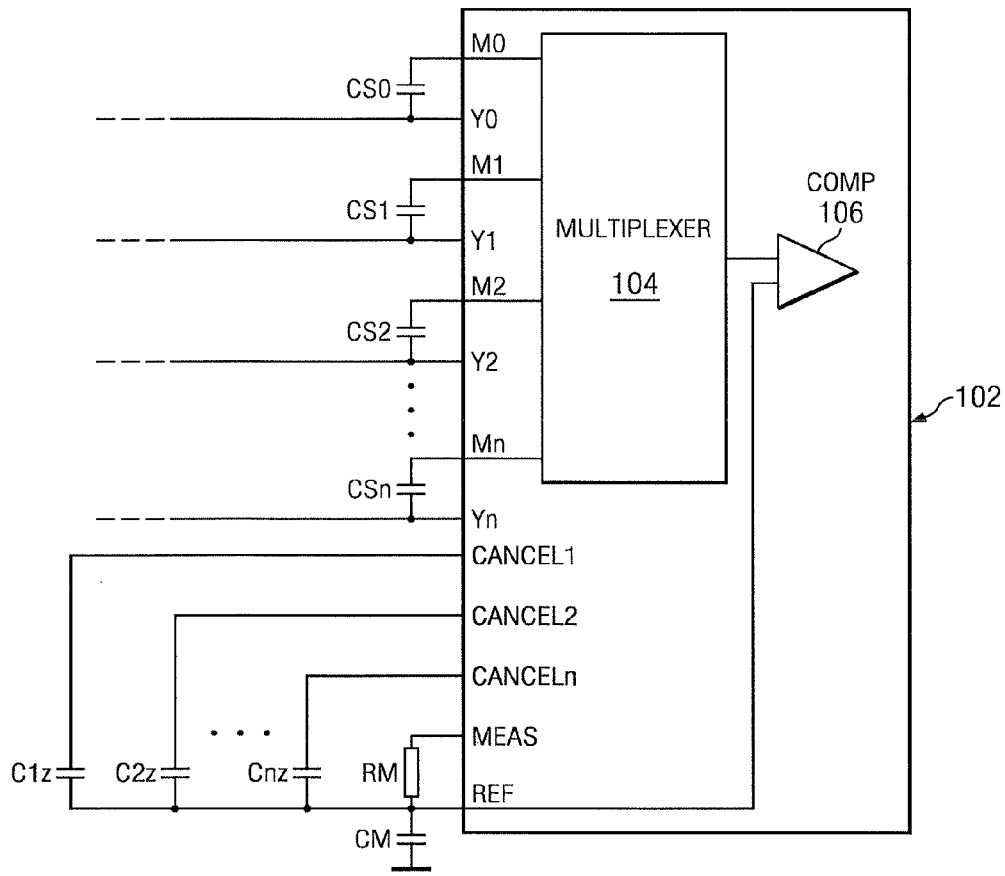
FIG. 4B illustrates an example system for measuring voltage using capacitive charging through multiple capacitors.

FIG. 4B illustrates an example system for measuring voltage using capacitive charging through multiple capacitors. As illustrated in the example of FIG. 4B, an amount of charge may be transferred from each additional capacitor C1z-Cnz coupled in series with the measurement capacitor CM prior to resistive charging through measurement resistor RM. As discussed above, the voltage across selected one of sampling capacitors CS0-CSn is transmitted to comparator 106 through corresponding input M0-Mn of multiplexer 104. Charging of the measurement capacitor CM may be performed by providing a voltage from one of terminals CANCEL1-CANCELn coupled to a terminal of capacitors C1z-Cnz. Each capacitor C1z-Cnz in turn transfers charge to measurement capacitor CM. The amount of charge transferred by each depending on the relative capacitance of each additional capacitor C1z-Cnz to measurement capacitor CM. As discussed above, resistive charging of measurement capacitor CM through measurement resistor RM predominates the charging process after charge transfers from capacitors C1z-Cnz.

Figure 5:
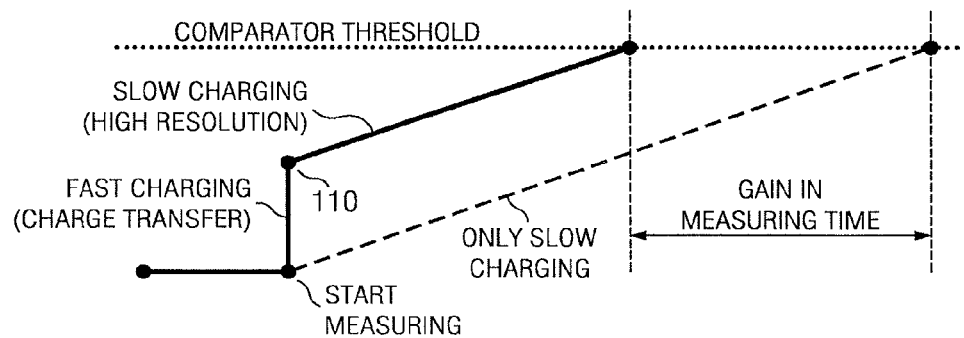
FIG. 5 illustrates example voltage across the measurement capacitor in the example system of FIG. 4A over time.

FIG. 5 illustrates example voltage across the measurement capacitor in the example system of FIG. 4A over time. As illustrated in the example of FIG. 5, initial charging of the measurement capacitor is predominantly from charge transfer through the additional capacitor CZ coupled in series with the measurement capacitor. The amount of charge transferred from additional capacitor CZ, as well as voltage 110 at terminal REF, may be determined from supply voltage applied to the capacitor CZ, as well as the relative values of CZ and CM. As discussed above, after the charge transfer, further charging of the measurement capacitor beyond voltage 110 arises predominantly from resistive charging through the measurement resistor. The rate of increase in the voltage across the measurement capacitor may be determined by the resistance of the measurement resistor. As illustrated by the example of FIG. 5, the addition of capacitive charging to resistive charging of the measurement capacitor achieves a reduction of elapsed voltage measurement time compared to resistive charging alone.

Figure 6:
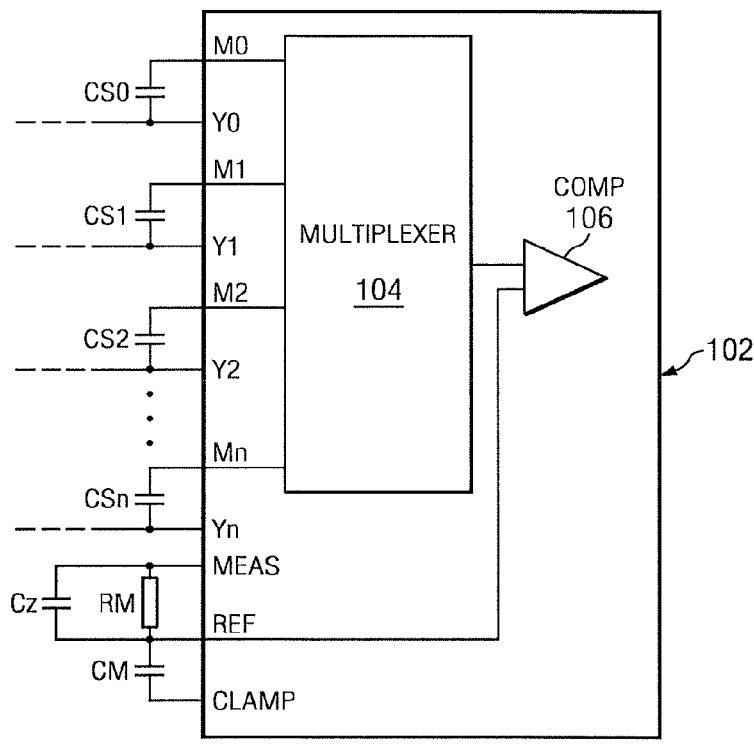
FIG. 6 illustrates an example system for measuring voltage using adaptive charge cancellation.

FIG. 6 illustrates an example system for measuring voltage using adaptive charge cancellation. As illustrated in the example of FIG. 6, controller 102 may be configured in a similar fashion to the system of FIG. 4A, except of measurement capacitor CM may be coupled between terminal REF and terminal CLAMP. In particular embodiments, terminal CLAMP may be configured to alternately provide either ground or a high-impedance state, e.g., float, to one terminal of measurement capacitor CM. For each charging cycle, an amount of charge will be transferred from additional capacitor CZ to the measurement capacitor CM, as discussed below.

TABLE 2 illustrates an example sequence of operations for measuring voltage using adaptive charge cancellation. Steps 1-10 (not shown) transfer charge induced on the sense electrode to the associated sampling capacitor CS0-CSn, as discussed in TABLE 1. Steps 11-20 measure voltage across one of sampling capacitors CS0-CSn by measuring the amount of time elapsed for a state of an output of the comparator 106 to change. In particular embodiments, step 20 performs step 11-19 for predetermined number of charge transfers. In other particular embodiments, the predetermined number of charge transfers may be equal to a burst length of a touch sensor. Steps 21-22 measure voltage across selected one of sampling capacitors CS0-CSn by measuring the amount of time elapsed from the start of charging measurement capacitor CM until the voltage across measurement capacitor CM through terminal REF is substantially equal or higher than the voltage across the selected one of sampling capacitors CS0-CSn, as discussed above. In other particular embodiments, step 23 performs steps 11-22 for each input M0-Mn of multiplexer 104. Although this disclosure describes and illustrates a particular sequence of steps in TABLE 2, this disclosure contemplates any suitable sequence of steps in system 100 for measuring voltages.

Figure 7:
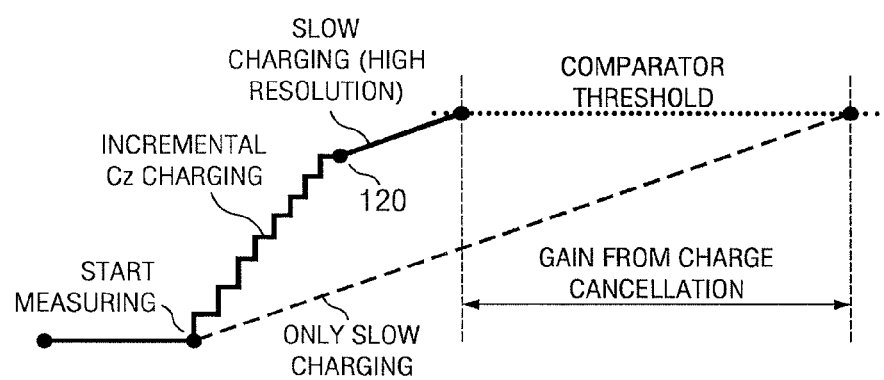
FIG. 7 illustrates example voltage across the measurement capacitor in the example system of FIG. 6 over time.

FIG. 7 illustrates example voltage across the measurement capacitor in the example system of FIG. 6 over time. As illustrated in the example of FIG. 7, initial charging of the measurement capacitor is predominantly through multiple charge transfers through additional capacitor CZ coupled in series with the measurement capacitor. After each charge transfer from capacitor CZ, the incremental increase in the voltage at terminal REF may be determined by the supply voltage transmitted by terminal MEAS and the relative capacitances of capacitor CZ and the measurement capacitor. After predetermined number of charge transfers, further charging of the measurement capacitor from voltage 120 arises predominantly from resistive charging through the measurement resistor. As illustrated by the example of FIG. 7, capacitive charging through adaptive charge cancellation in addition to resistive charging of the measurement capacitor achieves a reduction of elapsed time for the voltage of terminal REF to substantially equal the voltage of selected sampling capacitor over resistive charging alone.

Figure 8B:
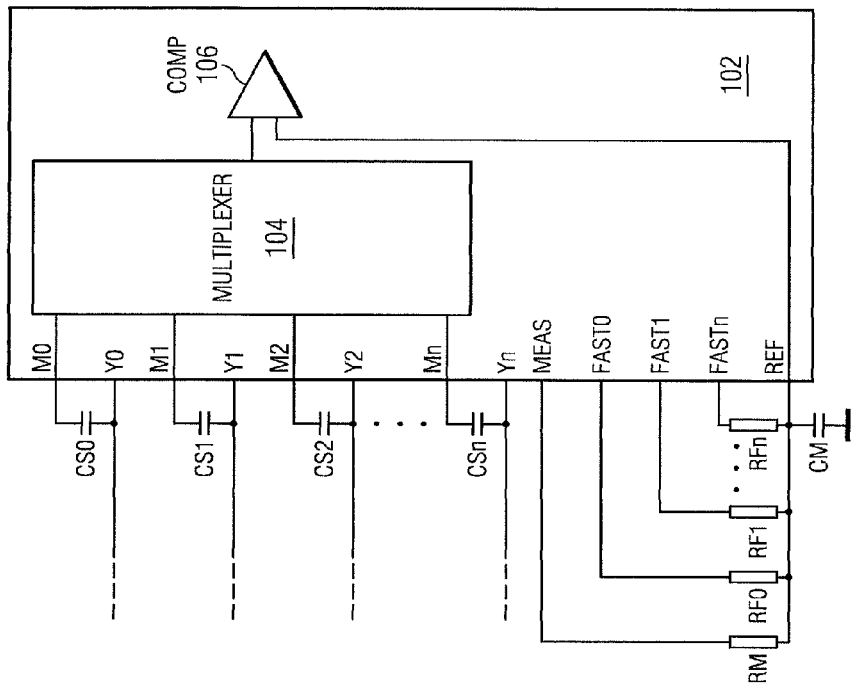
FIG. 8B illustrates an example system for measuring voltage using resistive charging through multiple resistors.
Figure 8A:
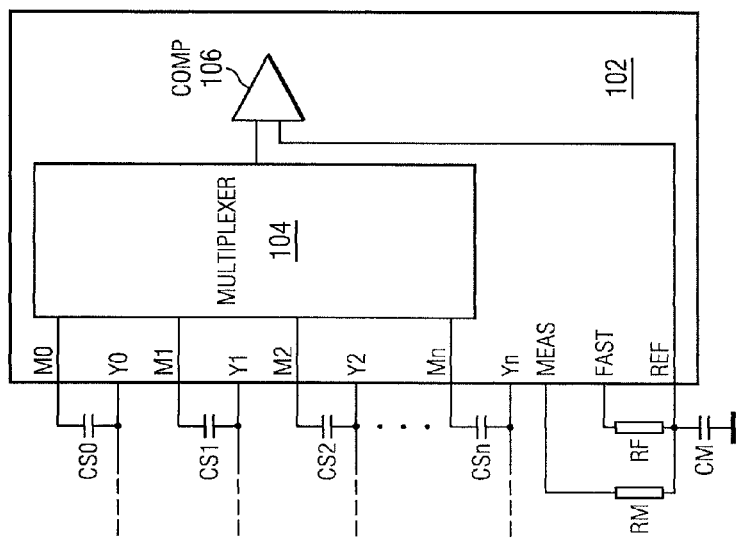
FIG. 8A illustrates an example system for measuring voltage using resistive charging through a single additional resistor.

FIG. 8A illustrates an example system for measuring voltage using resistive charging through a single additional resistor. As illustrated in the example of FIG. 8A, example system 100 of FIG. 1 may be configured for resistive charging using an additional resistor RF coupled in series with measurement capacitor CM. Charge may be injected to measurement capacitor CM at a different rate, i.e., current, using additional resistor RF compared to resistive charging entirely through measurement resistor RM. In particular embodiments, the resistance of resistor RF is smaller than the resistance of measurement resistor RM.

TABLE 3 illustrates an example sequence of operations for measuring voltage using resistive charging using a single resistor. A voltage, e.g., a power supply voltage, for injecting charge to the measurement capacitor CM is transmitted to resistor RF by controller 102 through terminal FAST. Steps 1-10 (not shown) transfer charge induced on the sense electrode to the associated sampling capacitor CS0-CSn, as discussed in TABLE 1. Steps 11-16 measure voltages across

TABLE 2

| Step | X | Y | REF | M | CLAMP | MEAS | Description |
|---|---|---|---|---|---|---|---|
| 11 | 0 | 0 | 0 | F | 0 | 0 | Connect analog comparator 106 to multiplexer 104 and terminal MEAS. Select an input M0-Mn of multiplexer 104. Connect sense lines Y0-Yn to GND, set drive lines X0-Xn to GND |
| 12 | 0 | 0 | F | F | 0 | 1 | Make charge transfer between Cz and CM. |
| 13 | 0 | 0 | F | F | 0 | F | End of the charge transfer between Cz and CM |
| 14 | 0 | 0 | F | F | F | F | Float CLAMP terminal |
| 15 | 0 | 0 | 1 | F | F | F | Connect M to Vcc and prepare for discharging of Cz |
| 16 | 0 | 0 | 1 | F | F | 1 | Discharge Cz by setting terminal MEAS and REF to Vcc |
| 17 | 0 | 0 | 1 | F | F | F | End of Cz discharging |
| 18 | 0 | 0 | F | F | F | F | Float selected multiplexer input M0-Mn |
| 19 | 0 | 0 | F | F | 0 | F | Prepare for the next charge transfer |
| 20 | | | | | | | Loop between Cz & CM - Go To Step 12 N times to generate the voltage on CM |
| 21 | 0 | 0 | F | F | 0 | 1 | Start measuring the voltage on multiplexer input M0-Mn by charging CM through RM - measure the time until the comparator 106 output changes state |
| 22 | 0 | 0 | 0 | | 0 | 0 | Discharging measurement capacitor CM through the comparator 106 input and terminals REF and CLAMP |
| 23 | | | | | | | Loop - Go To Step 11 for each multiplexer input M0-Mn |
| 24 | 0 | 0 | 0 | | 0 | 0 | Discharge all capacitors |

Figure 9:
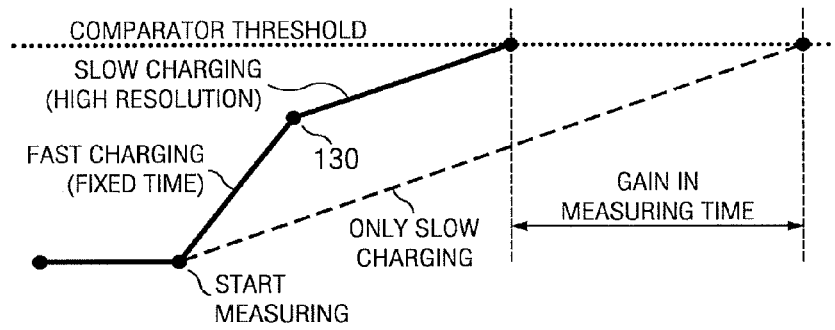
FIG. 9 illustrates example voltage across the measurement capacitor in the example system of FIG. 8A over time.

F = floating, i.e., high-impedance state
0 = logic low
1 = logic high sampling capacitors CS0-CSn by measuring the amount of time elapsed for a state of output of the comparator 106 to change. Steps 12-13 measure voltage across the selected one of sampling capacitors CS0-CSn by measuring the amount of time elapsed from the start of charging measurement capacitor CM until the voltage across measurement capacitor CM through terminal REF is equal or higher than the voltage across the selected one of sampling capacitors CS0-CSn, as discussed above. Step 12 initiates charging of the measurement capacitor CM by transmitting a voltage to terminal MEAS and FAST. Step 13 discontinues resistive charging through resistor RF and at this time, resistive charging through measurement resistor RM predominates charging of measurement capacitor CM. In particular embodiments, step 14 performs steps 11-13 for each input M0-Mn of multiplexer 104. Although this disclosure describes and illustrates a particular sequence of steps in TABLE 3, this disclosure contemplates any suitable sequence of steps in system 100 for measuring voltages.

capacitor through resistor RF, i.e., current, may be determined from supply voltage applied to resistor RF, as well as the resistance of resistor RF. As discussed above, after the charge injection through resistor RF, further charging of the measurement capacitor from voltage 130 arises predominantly from resistive charging through the measurement resistor. The rate of increase in the voltage across the measurement capacitor may be determined by the resistance of the measurement resistor and resistor RF. As illustrated by the example of FIG. 9, resistive charging through a combination of the measurement resistor and resistor RF achieves a reduction of elapsed voltage measurement time compared to resistive charging through the measurement resistor alone.

Figure 10A:
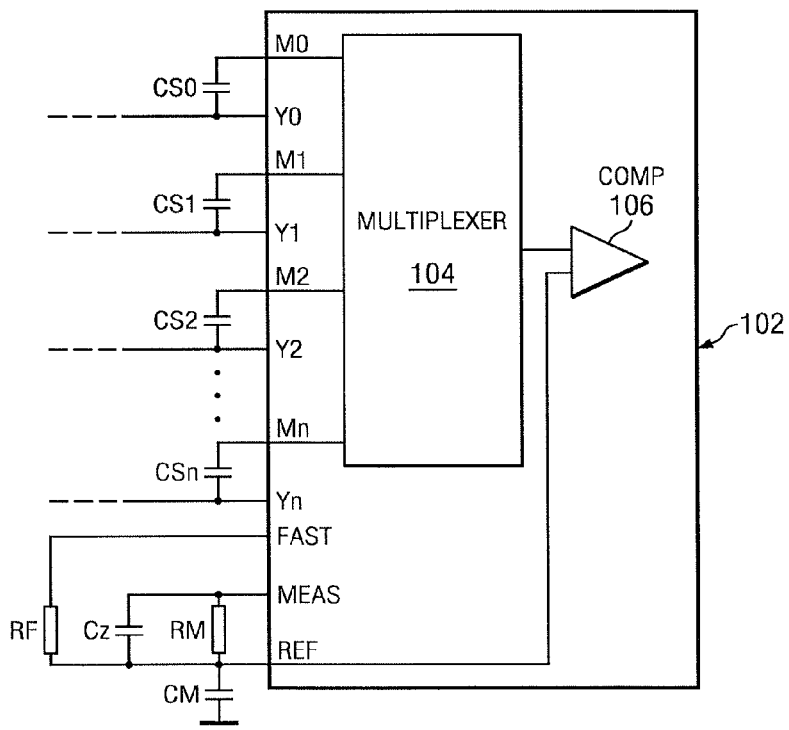
FIG. 10A illustrates an example system for measuring voltage using resistive and capacitive charging through a single resistor and capacitor.

FIG. 10A illustrates an example system for measuring voltage using resistive and capacitive charging through a single resistor and capacitor. As illustrated in the example of FIG. 10A, example system 100 of FIG. 1 may be configured for a combination of resistive and capacitive charging using additional resistor RF and capacitor Cz coupled in series with

TABLE 3

| Step | X | Y | M | FAST | MEAS | Description |
|------|---|---|---|------|------|-------------|
| 11 | 0 | 0 | F | 0 | 0 | Connect analog comparator 106 to multiplexer 104 and terminal REF. Select desired input M0-Mn of the multiplexer. Connect sense lines Y0-Yn to GND, set drive lines to GND |
| 12 | 0 | 0 | F | 1 | 1 | Start measuring the voltage on selected multiplexer input M0-Mn by charging CM through RM and RF. |
| 13 | 0 | 0 | F | F | 1 | Float FAST terminal - end of the fast charging. Measure with the time until the comparator 106 flips |
| 14 | 0 | 0 | F | 0 | 0 | Discharging sampling capacitor CM through the comparator 106 input and terminals MEAS and FAST |
| 15 |   |   |   |   |   | Loop - Go To Step 11 for each multiplexer input M0-Mn |
| 16 | 0 | 0 | 0 |   | 0 | Discharge all capacitors |

F = floating, i.e., high-impedance state
0 = logic low
1 = logic high

FIG. 8B illustrates an example system for measuring voltage using resistive charging through multiple resistors. As illustrated in the example of FIG. 8B, example system 100 of FIG. 8A may be configured for resistive charge using multiple resistors RF0-RFn coupled in series with measurement capacitor CM. Resistive charging of the measurement capacitor CM may be performed by providing a voltage from one of terminals FAST11-FASTn coupled to a terminal of resistors RF0-RFn. As discussed above, charge may be injected to measurement capacitor CM at different rates using additional resistors RF0-RFn compared to resistive charging entirely through measurement resistor RM. In particular embodiments, the resistance of each resistor RF0-RFn is smaller than the resistance of measurement resistor RM. A voltage, e.g., a power supply voltage, for injecting charge to the measurement capacitor CM is transmitted to resistors RF0-RFn by controller 102 through corresponding terminals FAST0-FASTn. In particular embodiments, the application of voltage to each resistor RF0-RFn is discontinued in a sequence based on the voltage across the measurement capacitor CM measured at terminal REF.

FIG. 9 illustrates example voltage across the measurement capacitor in the example system of FIG. 8A over time. As illustrated in the example of FIG. 9, initial charging of the measurement capacitor is predominantly from charge injected to the measurement capacitor through additional resistor RF coupled in series with the measurement capacitor. The rate in which charge is injected to the measurement measurement capacitor CM. As discussed in FIG. 8A, charge may be injected to measurement capacitor CM at a different rate, i.e., current by using additional resistor RF compared to resistive charging entirely through measurement resistor RM. In addition, as discussed in FIG. 4A, a predetermined amount of charge may be transferred from additional capacitor Cz coupled in series with the measurement capacitor CM prior to resistive charging through measurement resistor RM. In particular embodiments, the resistance of resistor RF is smaller than the resistance of measurement resistor RM and the capacitance of capacitor Cz is smaller than the capacitance of measurement capacitor CM.

Figure 10B:
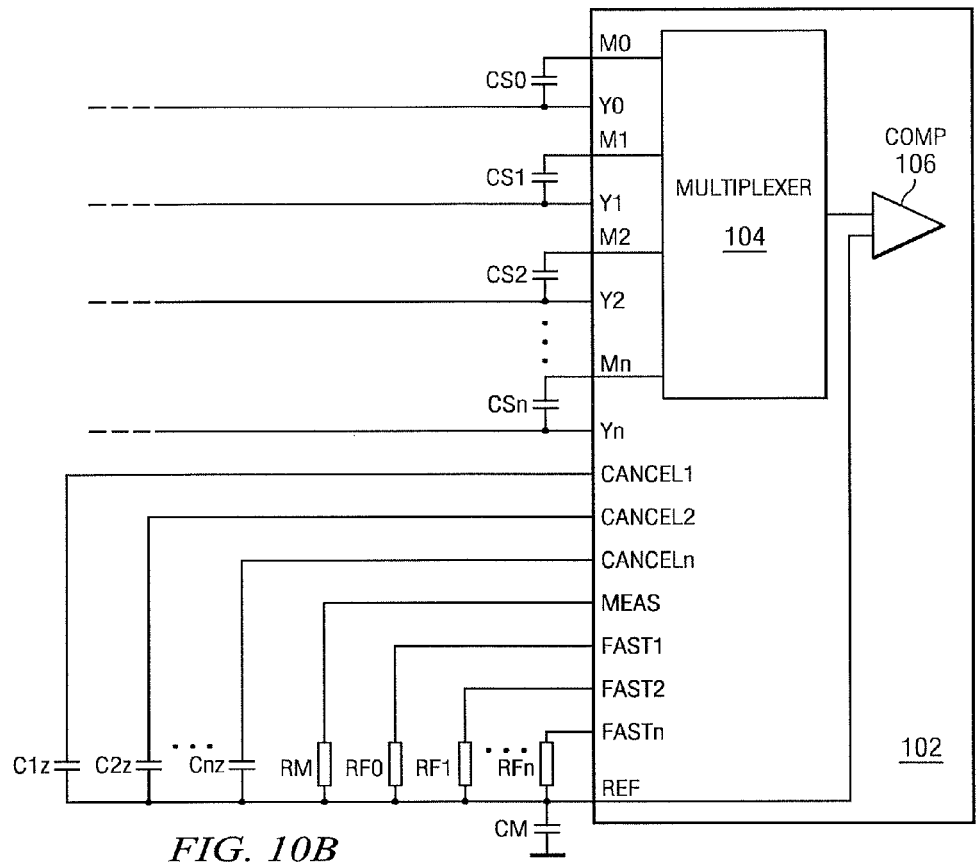
FIG. 10B illustrates an example system for measuring voltage using resistive and capacitive charging through multiple resistors and capacitors.

FIG. 10B illustrates an example system for measuring voltage using resistive and capacitive charging through multiple resistors and capacitors. As illustrated in the example of FIG. 10B, example system 100 of FIG. 10A may be configured for resistive and capacitive charging using multiple resistors RF0-RFn and capacitors C1z-Cnz coupled in series with measurement capacitor CM. As discussed in FIG. 4A, charge may be injected to measurement capacitor CM at different rates using additional resistors RF0-RFn compared to resistive charging entirely through measurement resistor RM. Resistive charging of the measurement capacitor CM may be performed by providing a voltage from one of terminals FAST11-FASTn coupled to a terminal of resistors RF0-RFn. In particular embodiments, the application of voltage to each resistor RF0-RFn is discontinued in a sequence based on the voltage across the measurement capacitor CM measured at terminal REF.

As discussed in FIG. 4B, capacitive charging of the measurement capacitor CM may be performed by providing a voltage from one of terminals CANCEL1-CANCELn coupled to a terminal of capacitors C1z-Cnz. Each capacitor C1z-Cnz in turn transfers charge to measurement capacitor CM. The amount of charge transferred by each capacitor C1z-Cnz depends on the relative capacitance of each additional capacitor C1z-Cnz to measurement capacitor CM.

Figure 11:
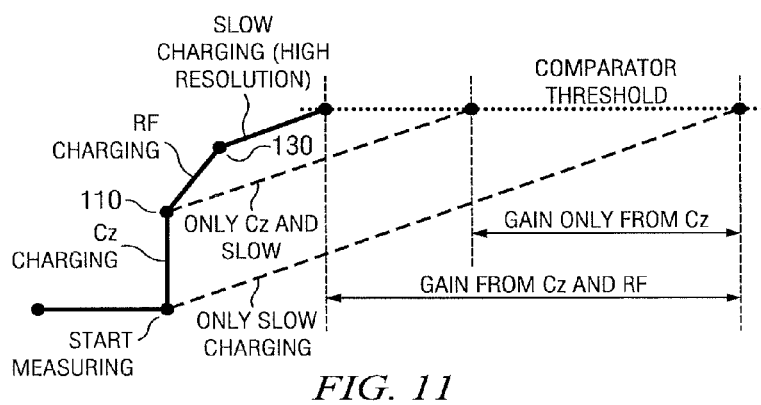
FIG. 11 illustrates example voltage across the measurement capacitance in the example system of FIG. 10A over time.

FIG. 11 illustrates example voltage across the measurement capacitance in the example system of FIG. 10A over time. As illustrated in the example of FIG. 11, charging of the measurement capacitor may be analyzed in three stages. One stage charges the measurement capacitor predominantly from charge transfer through additional capacitor CZ coupled in series with the measurement capacitor to voltage 110. As discussed in FIG. 5, the amount of charge transferred from additional capacitor CZ may be determined from supply voltage applied to the capacitor CZ, as well as the relative values of capacitor CZ and the measurement capacitor.

Another stage charges the measurement capacitor predominantly from charge injected to the measurement capacitor through additional resistor RF coupled in series with the measurement capacitor. The rate in which charge is injected to the measurement capacitor through resistor RF may be determined from the supply voltage applied to resistor RF, as well as the resistance of resistor RF. Another stage charges the measurement capacitor from voltage 130 predominantly from resistive charging through the measurement resistor. As illustrated by the example of FIG. 11, resistive charging through a combination of the capacitive charging through capacitor CZ and resistive charging through measurement resistor and resistor RF achieves a reduction of elapsed voltage measurement time compared to resistive charging through the measurement resistor alone.

Figure 12:
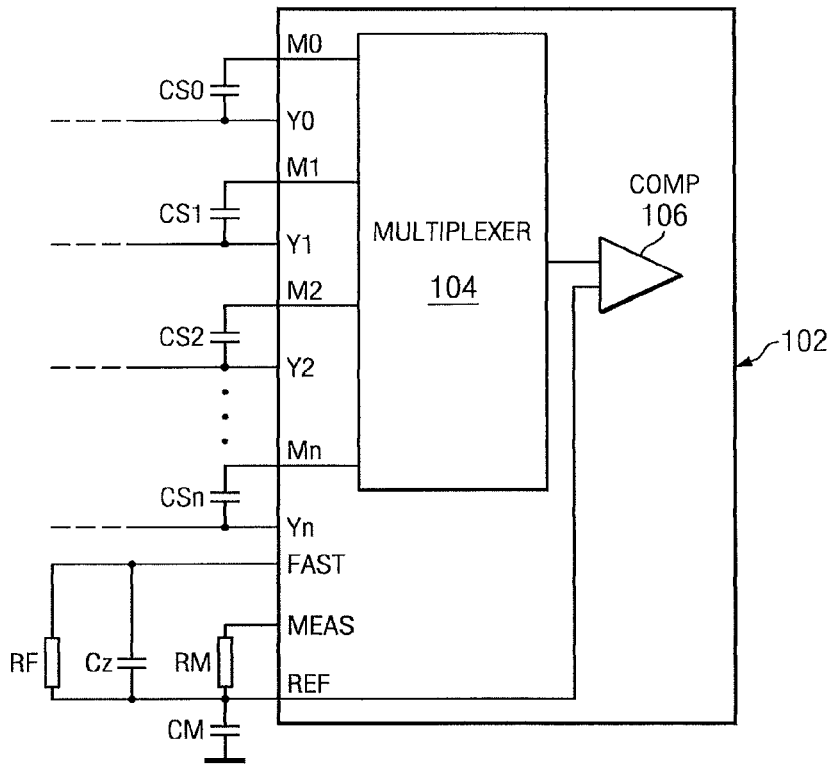
FIG. 12 illustrates an example system for measuring voltage using resistive and capacitive charging through a parallel resistor and capacitor.

FIG. 12 illustrates an example system for measuring voltage using resistive and capacitive charging through a parallel resistor and capacitor. In particular embodiments, a parallel combination of additional resistor RF and additional capacitor Cz may be coupled in series with measurement capacitor CM. During charging of measurement capacitor CM, noise from a power supply (not shown) may be introduced into system 100 through capacitor Cz. After resistive charging through additional resistor RE, additional capacitor Cz may be decoupled from the power supply. Decoupling additional capacitor Cz from the power supply shields voltage measurement by system 100 from power supply noise.

Figure 13:
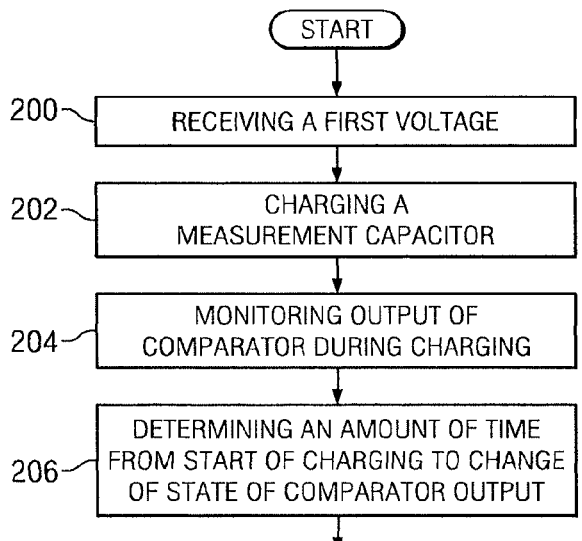
FIG. 13 illustrates an example method for measuring voltage.

FIG. 13 illustrates an example method for measuring voltage. The method may start at operation 200, an example system receives one of a first voltage. In particular embodiments, each first voltage may be stored as a voltage across one of sense capacitors. At operation 202, example system charges a measurement capacitor. In particular embodiments, the measurement capacitor may be charged by resistive charging through an additional resistor coupled in series to the measurement capacitor. In other particular embodiments, the measurement capacitor may be charged by capacitive charging through an additional capacitor coupled in series to the measurement capacitor. Operation 204 monitors output of a comparator during charging of the measurement capacitor. In particular embodiments, the comparator output may be based on the first voltage stored across one of sense capacitors and a second voltage stored across the measurement capacitor, as illustrated in FIG. 1. Depending on the input configuration of the comparator, the output of the comparator may change state when the second voltage becomes approximately equal or greater than the first voltage stored across one of sense capacitors. At operation 206, an amount of time from a start of charging the measurement capacitor through the measurement resistor until when the change of state of the comparator output is determined, at which point the method may end. Although this disclosure describes and illustrates particular operations of the method of FIG. 13 as occurring in a particular order, this disclosure contemplates any suitable operations of the method of FIG. 13 occurring in any suitable order. Moreover, although this disclosure describes and illustrates particular components carrying out particular steps of the method of FIG. 13, this disclosure contemplates any suitable combination of any suitable components carrying out any suitable operations of the method of FIG. 13.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:
1. A method comprising:
  receiving one of a plurality of first voltages, each of the first voltages resulting at least in part from a signal applied to an electrode of each of one or more nodes of a capacitive touch sensor;

receiving a second voltage across a measurement capacitor, the second voltage resulting at least in part on charging the measurement capacitor through application of a pre-determined voltage;

monitoring an output voltage during the charging of the measurement capacitor, the output voltage changing state based at least in part on a comparison of the second voltage relative to the one of the first voltages; and determining whether a touch input has occurred based at least in part on an amount of time from a start of the charging of the measurement capacitor to a change in the state of the output voltage.

2. The method of claim 1, wherein:

one of the first voltages is coupled to a first input of a comparator;

the second voltage across the measurement capacitor is coupled to a second input of the comparator; and the output voltage is provided by an output terminal of the comparator.

3. The method of claim 2, wherein charging the measurement capacitor comprises:

applying the pre-determined voltage to the measurement capacitor through a first resistor coupled to the second input of a comparator for a pre-determined amount of time; and applying the pre-determined voltage to the measurement capacitor through a second resistor coupled to the second input of the comparator, wherein a resistance of the first resistor is lower than a resistance of the second resistor.

4. The method of claim 2, wherein charging the measurement capacitor comprises:

applying the pre-determined amount of charge to the measurement capacitor through application of the pre-determined voltage to a charging capacitor coupled to the second input of a comparator; and applying the pre-determined voltage to the measurement capacitor through a resistor coupled to the second input of a comparator.

5. The method of claim 1, wherein charging the measurement capacitor comprises:

applying a pre-determined amount of charge to the measurement capacitor through one or more charge transfers, each charge transfer comprising:

transferring a pre-determined amount of charge to the measurement capacitor through application of the pre-determined voltage to a charging capacitor coupled to the measurement capacitor; and discharging the charging capacitor through application of a high-impedance state to terminals of the charging capacitor.

6. The method of claim 1, wherein monitoring the output voltage comprises determining whether the second voltage is substantially equal to the one of the first voltages.

7. The method of claim 1, wherein each of the first voltages is across one of a plurality of sampling capacitors, each of the sampling capacitors being coupled to one of a plurality of inputs of a multiplexer.

8. A circuit configured to:

receive one of a plurality of first voltages, each of the first voltages resulting at least in part from a signal applied to an electrode of each of one or more nodes of a capacitive touch sensor;

receive a second voltage across a measurement capacitor, the second voltage resulting at least in part on charging the measurement capacitor through application of a pre-determined voltage;

monitor an output voltage during the charging of the measurement capacitor, the output voltage changing state based at least in part on a comparison of the second voltage relative to the one of the first voltages; and determining whether a touch input has occurred based at least in part on an amount of time from a start of the charging of the measurement capacitor to a change in the state of the output voltage.

9. The circuit of claim 8, wherein:

one of the first voltages is coupled to a first input of a comparator;

the second voltage across the measurement capacitor is coupled to a second input of the comparator; and the output voltage is provided by an output terminal of the comparator.

10. The circuit of claim 9, wherein the circuit is further configured to:

apply the pre-determined voltage to the measurement capacitor through a first resistor coupled to the second input of a comparator for a pre-determined amount of time; and apply the pre-determined voltage to the measurement capacitor through a second resistor coupled to the second input of the comparator, wherein a resistance of the first resistor is lower than a resistance of the second resistor.

11. The circuit of claim 9, wherein the circuit is further configured to:

apply the pre-determined amount of charge to the measurement capacitor through application of the pre-determined voltage to a charging capacitor coupled to the second input of a comparator; and apply the pre-determined voltage to the measurement capacitor through a resistor coupled to the second input of a comparator.

12. The circuit of claim 8, wherein the circuit is further configured to:

apply a pre-determined amount of charge to the measurement capacitor through one or more charge transfers, each charge transfer comprising:

transfer a pre-determined amount of charge to the measurement capacitor through application of the pre-determined voltage to a charging capacitor coupled to the measurement capacitor; and discharge the charging capacitor through application of a high-impedance state to terminals of the charging capacitor.

13. The circuit of claim 8, wherein the circuit is further configured to determine whether the second voltage is substantially equal to the one of the first voltages.

14. The circuit of claim 8, wherein each of the first voltages is across one of a plurality of sampling capacitors, each of the sampling capacitors being coupled to one of a plurality of inputs of a multiplexer.

15. An apparatus comprising:

a capacitive touch sensor having a plurality of nodes; and a computer-readable non-transitory storage medium coupled to the capacitive touch sensor that embodies logic that is configured when executed to:

receive one of a plurality of first voltages, each of the first voltages resulting at least in part from a signal applied to an electrode of each of the nodes of the capacitive touch sensor;

receive a second voltage across a measurement capacitor, the second voltage resulting at least in part on charging the measurement capacitor through application of a pre-determined voltage;

monitor an output voltage during the charging of the measurement capacitor, the output voltage changing state based at least in part on a comparison of the second voltage relative to the one of the first voltages; and determine whether a touch input has occurred based at least in part on an amount of time from a start of the charging of the measurement capacitor to a change in the state of the output voltage.

16. The apparatus of claim 15, wherein:

one of the first voltages is coupled to a first input of a comparator;

the second voltage across the measurement capacitor is coupled to a second input of the comparator; and the output voltage is provided by an output terminal of the comparator.

17. The apparatus of claim 16, wherein the logic is further configured to:

apply the pre-determined voltage to the measurement capacitor through a first resistor coupled to the second input of a comparator for a pre-determined amount of time; and apply the pre-determined voltage to the measurement capacitor through a second resistor coupled to the second input of the comparator, wherein a resistance of the first resistor is lower than a resistance of the second resistor.

18. The apparatus of claim 16, wherein the logic is further configured to:

apply the pre-determined amount of charge to the measurement capacitor through application of the pre-determined voltage to a charging capacitor coupled to the second input of a comparator; and apply the pre-determined voltage to the measurement capacitor through a resistor coupled to the second input of a comparator.

19. The apparatus of claim 15, wherein the logic is further configured to:

apply a pre-determined amount of charge to the measurement capacitor through one or more charge transfers, each charge transfer comprising:

transfer a pre-determined amount of charge to the measurement capacitor through application of the pre-determined voltage to a charging capacitor coupled to the measurement capacitor; and discharge the charging capacitor through application of a high-impedance state to terminals of the charging capacitor.

20. The apparatus of claim 15, wherein the logic is further configured to determine whether the second voltage is substantially equal to the one of the first voltages.

* * * * *